United States Patent [19]

Yamaguchi et al.

[11] Patent Number: 4,741,006
[45] Date of Patent: Apr. 26, 1988

[54] UP/DOWN COUNTER DEVICE WITH REDUCED NUMBER OF DISCRETE CIRCUIT ELEMENTS

[75] Inventors: Akira Yamaguchi, Yokohama; Koichi Satoh; Hidemi Iseki, both of Kawasaki; Hiroshi Shigehara, Yokohama, all of Japan

[73] Assignee: Kabushiki Kaisha Toshiba, Kawasaki, Japan

[21] Appl. No.: 754,398

[22] Filed: Jul. 12, 1985

[30] Foreign Application Priority Data

Jul. 12, 1984 [JP] Japan .................. 59-144678
Mar. 30, 1985 [JP] Japan .................. 60-66812

[51] Int. Cl.⁴ .................. H03K 23/00; H03K 23/04
[52] U.S. Cl. .................. 377/126; 377/115; 377/116; 307/272.1
[58] Field of Search .............. 377/126, 123, 115, 116, 377/124, 125; 307/272 A

[56] References Cited

U.S. PATENT DOCUMENTS

| | | | |
|---|---|---|---|
| 3,277,380 | 10/1966 | Paufve | 377/123 |
| 3,500,022 | 3/1970 | Toscano | 377/126 |
| 3,588,475 | 6/1971 | Scott | 377/126 |
| 3,614,580 | 10/1971 | Eto | 377/124 |
| 3,632,997 | 1/1972 | Froemke | 377/126 |
| 3,671,875 | 6/1972 | Pento | 377/126 |
| 4,037,085 | 7/1977 | Minorikawa | 377/116 |
| 4,378,505 | 3/1983 | Scavuzzo | 307/272 A |

OTHER PUBLICATIONS

Toshiba, "Semiconductor Circuit Technique Data", C2MOS (Separate Standard) Fifth Edition pp. 275–279, Aug. 1982.

Primary Examiner—Stanley D. Miller
Assistant Examiner—K. Ohralik
Attorney, Agent, or Firm—Finnegan, Henderson, Farabow, Garrett & Dunner

[57] ABSTRACT

An up/down counter device includes a D-type flip-flop circuit for producing a count signal of the 0th bit in synchronism with a clock signal, and 1st to n-th flip-flop circuits for producing count signals of the 1st to the n-th bits in synchronism with a clock signal. The first logic circuit is connected between the output of the D-type flip-flop circuit and the JK terminals of the first flip-flop circuit. The first stage logic circuit includes a first logic circuit section supplied with an up/down mode signal and the output signal of the D-type flip-flop circuit, and a second logic circuit connected in series with with the first logic circuit. Each of the 2nd to the n-th stage logic circuits includes a first logic circuit which is connected between the output terminal of the prestage flip-flop circuit and the JK terminals of the post stage flip-flop circuit, and a second logic circuit section connected to the first logic circuit. The output of the first logic circuit section of each of the first to the n-th logic circuits is connected to the input of the first logic circuit section of the post stage logic circuit.

9 Claims, 5 Drawing Sheets

UP/DOWN COUNTER DEVICE WITH REDUCED NUMBER OF DISCRETE CIRCUIT ELEMENTS

BACKGROUND OF THE INVENTION

This invention relates to an up/down counter device operating in synchronism with clock signals.

One of the prior art up/down counter devices is a binary up/down counter TC4516BP manufactured by TOSHIBA. This counter TC 4516BP is configured as briefly explained below. The counter comprises one D-type flip-flop, three JK flip-flops, and three logic circuits for forming JK input signals to the JK flip-flops. Clock signals are coupled with the synchronizing signal input terminals of these flip-flops. The D-type flip-flop is short-circuited between the output terminal $\overline{Q}$ and the data input terminal to form a binary counter. The output signal Q is used as a count signal at the least significant digit, or of the 0th bit. The JK flip-flops are connected, at the JK input terminals, to the three logic circuits. The output signals of the JK flip-flops are used as the count signals of the 1st to the 3rd bits. Each logic circuit comprises two AND gates and an OR circuit coupled with the outputs of the AND gates. One of two AND gates of the first stage logic circuit receives the reversed signals of the output signal $\overline{Q0}$ of the D-type flip-flop, and an up/down mode signal U/D while the other AND gate receives the output signal $\overline{Q0}$ and the up/down mode signal U/D. The output signal of the OR gate of the first stage logic circuit inputs to the JK input terminal of the first stage flip-flop. The output signal Q1 of the first stage JK flip-flop, the output signal Q0 of the D-type flip-flop and the up/down mode signal U/D are separately applied to one of the AND gates of the second stage logic circuit. The signal Q1, the signal Q0 and the inverted up/down mode signal U/D are applied to the other AND gate. The output signal of the OR gate of the second stage logic circuit is supplied to the JK input terminal of the second stage JK flip-flop. One of the AND gates of the third stage logic circuit receives the output signal Q2 of the second stage JK flip-flop, the output signal Q1 of the first stage JK flip-flop, the output signal Q0 of the D-type flip-flop and the up/down mode signal U/D. The other AND gate receives the signals $\overline{Q2}$, $\overline{Q1}$, $\overline{Q0}$ and U/D. The output signal from the OR circuit of the third logic circuit is supplied to the JK input terminal of the third stage JK flip-flop.

In the prior up/down counter, thus arranged, as the number of stages of logic circuits for providing input signals for the associated flip-flops becomes larger, the input terminals of the AND gates of the logic circuits increase, one by one, in number. For this reason, in constructing the multi-bit counter, the number of the circuit elements required for the logic circuits exponentially increases with an increase in the number of the logic circuits.

Summary of the Invention

Accordingly, an object of this invention is to provide an up/down counter device which can avoid an abnormal increase in the number of the necessary circuit elements when the multi-bit counter is constructed.

To realize this object, an up/down counter device, according to this invention, comprises a binary counter for outputting a count signal representing a bit at the least significant digit, 1st to n-th stage flip-flops at the 1st to n-th significant digits and logic circuits associated with the flip-flops. The output terminal of the binary counter is connected to the first stage logic circuit. The output terminal of the binary counter is connected to the JK input terminals of the first stage flip-flop. An intermediate signal derived from the intermediate portion of the first stage logic circuit is applied to the input terminal of the second stage logic circuit. The output terminal of the second stage logic circuit is connected to the JK input terminal of the second stage flip-flop. The output terminal at the intermediate portion of that logic circuit is connected to the input terminal of the third logic circuit.

The output terminal of the logic circuit is coupled with the JK input terminal of the associated flip-flop. The intermediate signal of the logic circuit serves as an input signal to the next stage logic circuit. The input signal to the upper order flip-flop can be formed by supplying the intermediate signal from each logic circuit to the next stage logic circuit.

DETAILED DESCRIPTION OF THE PREFERRED EMBODIMENTS

Figure 1:
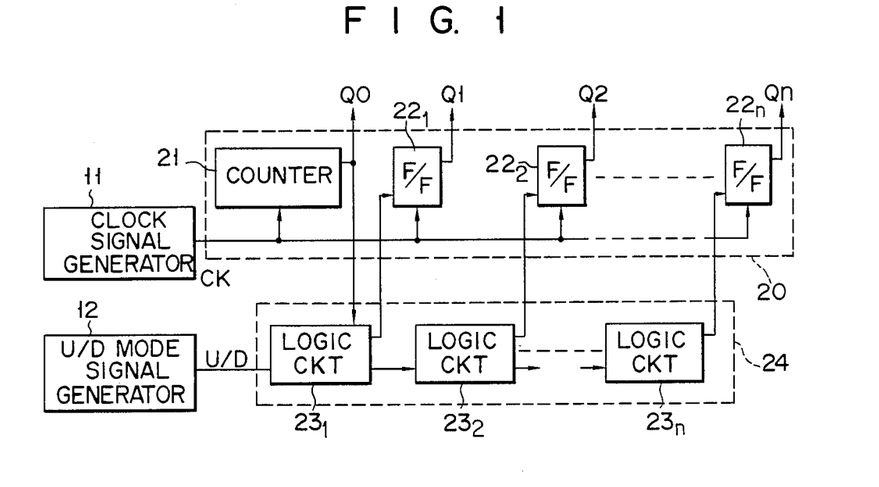
FIG. 1 shows a block diagram of an up/down counter device according to an embodiment of this invention.

FIG. 1 illustrates the scheme of an up/down counter device according to this invention. The up/down counter device comprises a counter section 20 including a binary counter 21 and n number of flip-flops $22_1$ to $22_n$, and a logic section 24 including logic circuits $23_1$ to $23_n$. A clock signal generator 11 is connected to the counter section 20 to control the operations of the binary counter 21 and all of the flip-flops $22_1$ to $22_n$. An up/down mode signal generator 12 is connected to the first stage logic circuit $23_1$ in the logic section 24 to selectively set up an operation mode of this counter device, i.e., an up count mode or a down count mode. As shown, the output of the binary counter 21 is supplied to the first stage logic circuit $23_1$. The output of the logic circuit $23_1$ is supplied to the input of the first stage of the flip-flop $22_1$. The output of the flip-flop $22_1$ is supplied to the input of the second stage logic circuit $23_2$. In this way, the output of the n-th logic circuit $23_n$ is supplied to the input of the n-th flip-flop $22_n$. The binary counter 21 frequency-divides a clock signal CK from the clock signal generator 11 into a factor of two and produces a count signal of the 0th bit, or the least significant bit. The logic circuit $23_1$ in the logic section 24 receives an up/down mode signal U/D from the up/down mode signal generator 12 and the output signal of the binary counter 21, and produces first and second output signals. The first output signal of the logic circuit $23_1$ is fed to the first stage flip-flop $22_1$. The second output signal is fed to the second stage logic circuit $23_2$. Upon receipt of the first output signal from the logic circuit $23_1$, the flip-flop $22_1$ produces first and second output signals under control of the clock signal CK from the clock signal generator 11. The first output signal from the flip-flop $22_1$ is used as a first bit count signal Q1. The second output signal is applied to the second stage logic circuit $23_2$. On the basis of the second output signals from the flip-flop $22_1$ and the logic circuit $23_1$, the second stage logic circuit $23_2$ produces first and second output signals. The first output signal of the logic circuit $23_2$ is fed to the second stage flip-flop $22_2$. Then, the flip-flop $22_2$ produces first and second output signals. The first output signal is used as a second bit signal Q2. The second output signal of the flip-flop $22_2$ is fed to the third stage logic circuit $23_3$. In this way, the subsequent bit signals Q3 to Qn are produced. The first and second output signals from each stage of the logic circuits $23_1$ to $23_n$ in the logic section 24 will frequently be referred to as final and intermediate signals, respectively. The reason for this is that the final signal is derived from the final stage of each logic circuit, while the intermediate signal is derived from the intermediate portion of the logic circuit. This will be more clearly understood when reading the subsequent detailed description based on the circuit diagrams.

Figure 2:
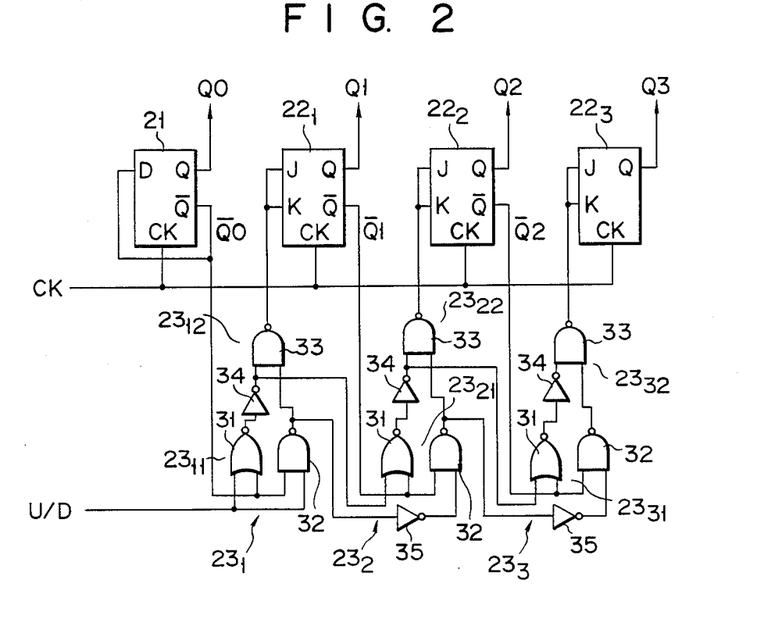
FIG. 2 shows a circuit diagram of the up/down counter device of FIG. 1.

FIG. 2 is a circuit diagram implementing the scheme of the up/down counter device illustrated in FIG. 1. In this example, the up/down counter device is illustrated as a 4-bit counter. A D-type flip-flop is used for the binary counter 21. In the binary counter 21, the complement output terminal $\overline{Q}$ and the data input terminal are shorted. The output signal Q0 of the binary counter 21 is used as the least significant bit signal, or the 0th bit signal of this counter. The counter section 20 includes three JK flip-flops $22_1$ to $22_3$. The output signals Q1 to Q3 of the flip-flops $22_1$ to $22_3$, respectively, serve as the 1st to the 3rd bit signals of the up/down counter device.

The logic section 24 comprises three logic circuits $23_1$ to $23_3$. The first stage logic circuit $23_1$ comprises a first logic circuit portion $23_{11}$, including a NOR gate 31, a NAND gate 32 and an inverter 34, and a second logic circuit portion $23_{12}$ having a NAND gate 33. The second and third stage logic circuits $23_2$ and $23_3$ each comprise a first logic circuit portion $23_{21}$ ($23_{31}$), including a NOR gate 31, a NAND gate 32 and inverters 34 and 35, and a second logic circuit portion $23_{22}$ ($23_{32}$) having a NAND gate 33.

In the first stage logic circuit $23_1$, the output signal $\overline{Q0}$ of the binary counter 21 in the counter section 20, and an up/down mode signal U/D from the up/down mode signal generator 12 (FIG. 1) are applied to the NOR gate 31. These signals $\overline{Q0}$ and U/D are also applied to the NAND gate 32. The output signal of the NOR gate 31 is connected through the inverter 34 to the NAND gate 33. The output signal of the NAND gatae 32 is directly connected to the NAND gate 33. The output signal from the NAND gate 33 is applied as a JK input signal to the 1st bit flip-flop $22_1$. The output signals of the inverter 34 and the NAND gate 32 are used as the intermediate signals to be transferred to the next stage logic circuit $23_2$.

In the next stage logic circuit $23_2$, the output signal $\overline{Q1}$ of the 1st bit flip-flop $22_1$, and the output signal of the inverter 34 in the first stage logic circuit $23_1$ are applied to the NOR gate 31. The signal $\overline{Q1}$ is applied directly to the NAND gate 32. The output signal of the NAND gate 32 in the logic circuit $23_1$ is applied through the inverter 35 to the NAND gate 32. The output signal of the NOR gate 31 is supplied through the inverter 34 to the NAND gate 33. The output signal of the NAND gate 32 is supplied directly to the NAND gate 33. The output signal of the NAND gate 33 is supplied as a JK input signal to the 2nd bit flip-flop $22_2$. The output signals of the inverter 34 and the NAND gate 32 are transferred as the intermediate signals to the succeeding stage logic circuit $23_3$.

In the logic circuit $23_3$, the output signal $\overline{Q2}$ of the 2nd bit flip-flop $22_2$, and the output signal of the inverter 34 in the second stage logic circuit $23_2$ are applied to the NOR gate 31. The signal $\overline{Q2}$ is applied directly to the NAND gate 32. The output signal of the NAND gate 32 in the logic circuit $23_2$ is applied through the inverter 35 to the NAND gate 32. The output signal of the NOR gate 31 is supplied through the inverter 34 to the NAND gate 33. The output signal of the NAND gate 32 is supplied directly to the NAND gate 33. The output signal of the NAND gate 33 is supplied as a JK input signal to the 3rd bit flip-flop $22_3$.

The operation of the up/down counter device, thus arranged, will be given. This device serves as an up-counter when the up/down mode signal U/D is logical "1", and serves as a down-counter when it is logical "0".

Figure 3:
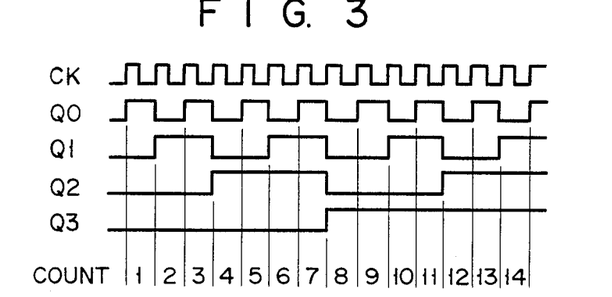
FIGS. 3 and 4, respectively, show time charts for explaining the up and down count operations of the up/down counter device of FIG. 2.

The up count operation will be given with reference to FIG. 3, illustrating a timing chart. Since the binary counter 21 frequency divides the clock signal CK into a factor of two, the count signal $\overline{Q0}$ has a period two times that of the clock signal CK. When the up/down mode signal U/D is logical "0", the output signal of the NAND gate 32 in the logic circuit $23_1$ remains in logical "1", irrespective of a logical state of the output signal of the binary counter 21. The NOR gate 31 serves as an inverter for inverting the output signal $\overline{Q0}$ of the binary counter 21. The inverter 34 further inverts the output signal from the NOR gate 31 and applied it to the NAND gate 33. At this time, the output signal of the NAND gate 32 is logical "1". Then, the NAND gate 33 serves as a mere inverter for inverting the output signal from the inverter 34. Accordingly, the JK input signal supplied from the first stage logic circuit $23_1$ to the 1st bit flip-flop $22_1$ is out of phase with the signal $\overline{Q0}$, i.e., in phase with the signal Q0. When the output signal from the logic circuit $23_1$ is logical "1", the flip-flop $22_1$ inverts the output signals Q1 and $\overline{Q1}$ at the leading edge of the clock signal CK. If, in the initial stage, the output signal Q1 of the flip-flop $22_1$ is logical "0", and the output signal $\overline{Q1}$ is logical "1", the output signal Q1 changes at the trailing edge of the signal Q0, as shown in FIG. 3, and has a period two times that of the output signal Q0 of the binary counter 21.

In the next stage logic circuit $23_2$, the NAND gate 32 receives, through the inverter 35, the logical "0" signal output from the NAND gate 32 in the first stage logic circuit $23_1$. For this reason, also in this logic circuit $23_2$, the output signal of the NAND gate 32 remains in logical "1", irrespective of a logical state of the output signal of the flip-flop $22_1$. The NOR gate 31 operates as an inverter for inverting the output signal $\overline{Q1}$ of the flip-flop $22_1$. The inverter 34 further inverts the output signal from the NOR gate 31 and applies it to the NAND gate 33. At this time, the output signal of the NAND gate 32 is logical "1". Then, the NAND gate 33 serves as a mere inverter for inverting the output signal from the inverter 34. Accordingly, the JK input signal supplied from the second stage logic circuit $23_2$ to the second bit flip-flop $22_2$ is out of phase with the signal $\overline{Q1}$, i.e., in phase with the signal Q1. When the output signal from the logic circuit $23_3$ is logical "1", the flip-flop $22_2$ inverts the output signals Q2 and $\overline{Q2}$ at the leading edge of the clock signal CK. If, in the initial stage, the output signal Q2 of the flip-flop $22_2$ is logical "0", and the output signal $\overline{Q2}$ is logical "1", the output signal Q2 changes in a logical level at the trailing edge of the signal Q1, as shown in FIG. 3, and has a period four times that of the output signal Q0 of the binary counter 21.

In the succeeding stage logic circuit $23_2$, the NAND gate 32 receives, through the inverter 35, the logical "0" signal output from the NAND gate 32 in the second stage logic circuit $23_2$. For this reason, also in this logic circuit $23_3$, the output signal of the NAND gate 32 remains in logical "1", irrespective of a logical state of the output signal of the flip-flop $22_2$. The NOR gate 31 operates as an inverter for inverting the output signal $\overline{Q2}$ of the flip-flop $22_2$. The inverter 34 further inverts the output signal from the NOR gate 31 and applies it to the NAND gate 33. At this time, the output signal of the NAND gate 32 is logical "1". Then, the NAND gate 33 serves as a mere inverter for inverting the output signal from the inverter 34. Accordingly, the JK input signal supplied from the third stage logic circuit $23_3$ to the third stage flip-flop $22_3$ is out of phase with the signal $\overline{Q2}$, i.e., in phase with the signal Q2. When the output signal from the logic circuit $23_3$ is logical "1", the flip-flop $22_3$ inverts the output signals Q3 and $\overline{Q3}$ at the leading edge of the clock signal CK. If, in the initial stage, the output signal Q3 of the flip-flop $22_3$ is logical "0", and the output signal $\overline{Q3}$ is logical "1", the output signal Q3 changes in a logical level at the trailing edge of the signal Q2, as shown in FIG. 3, and has a period eight times that of the output signal Q0 of the binary counter 21. In this way, when the up/down mode signal U/D is logical "0", this counter operates as an up-counter, with its counted values incrementing 1, 2, 3, ..., as shown in FIG. 3.

Figure 4:
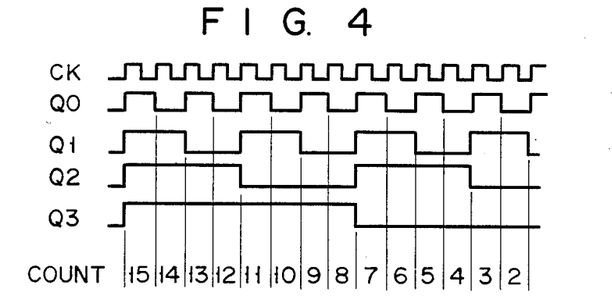

The down count operation will be given with reference to FIG. 4. Also in this mode, the binary counter 21 frequency-divides the clock signal CK into a factor of two, so that the count signal $\overline{Q0}$ has a period two times that of the clock signal CK. When the up/down mode signal U/D is logical "1", the output signal of the NOR gate 31 in the logic circuit $23_1$ remains in logical "1", irrespective of a logical state of the output signal of the binary counter 21. Accordingly, the output signal of the inverter 34 is always kept in logical "1". The NAND gate 32 serves as an inverter for inverting the output signal $\overline{Q0}$ of the binary counter 21. At this time, the output signal of the inverter 34 is logical "1". Then, the NAND gate 33 serves as a mere inverter for inverting the output signal from the NAND gate 32. Accordingly, the JK input signal supplied from the first stage logic circuit $23_1$ to the 1st bit flip-flop $22_1$ is in phase with the signal $\overline{Q0}$. When the input signal, or the output signal from the logic circuit $23_1$ is logical "1", the flip-flop $22_1$ inverts the output signals Q1 and $\overline{Q1}$ at the leading edge of the clock signal CK. If, in the initial stage, the output signal Q1 of the flip-flop $22_1$ is logical "0", and the output signal $\overline{Q1}$ is logical "1", the output signal Q1 changes in a logical level at the leading edge of the signal Q0, as shown in FIG. 4, and has a period two times that of the output signal Q0 of the binary counter 21.

In the next stage logic circuit $23_2$, the NOR gate 31 receives the logical "1" signal output from the inverter 34 in the first stage logic circuit $23_1$. For this reason, in this logic circuit $23_2$, the output signal of the NOR gate 31 remains in logical "0", irrespective of a logical state of the output signal of the flip-flop $22_1$. The output signal of the inverter 34 connecting to the NOR gate 31 is always kept logical "1". The NAND gate 32 operates as an inverter for inverting the output signal $\overline{Q1}$ of the flip-flop $22_1$. At this time, the output signal of the inverter 34 is logical "1". Then, the NAND gate 33 serves as a mere inverter for inverting the output signal from the NAND gate 32. Accordingly, the JK input signal supplied from the second stage logic circuit $23_2$ to the second bit flip-flop $22_2$ is in phase with the signal $\overline{Q1}$. When the output signal from the logic circuit $23_2$ is logical "1", the flip-flop $22_2$ inverts the input signal or the output signals Q2 and $\overline{Q2}$ at the leading edge of the clock signal CK. If, in the initial stage, the output signal Q2 of the flip-flop $22_2$ is logical "0", and the output signal $\overline{Q2}$ is logical "1", the output signal Q2 changes in a logical level at the trailing edge of the signal Q1, as shown in FIG. 4, and has a period four times that of the output signal Q0 of the binary counter 21.

In the logic circuit $23_3$, the NOR gate 31 receives the logical "1" signal output from the inverter 34 in the succeeding stage logic circuit $23_2$. For this reason, in this logic circuit $23_3$, the output signal of the NOR gate 31 remains in logical "0", irrespective of a logical state of the output signal of the flip-flop $22_2$. The output signal of the inverter 34 connecting to the inverter 34 is always kept in logical "1". The NAND gate 32 operates as an inverter for inverting the output signal $\overline{Q2}$ of the flip-flop $22_2$. At this time, the output signal of the inverter 34 is logical "1". Then, the NAND gate 33 serves as a mere inverter for inverting the output signal from the NAND gate 32. Accordingly, the JK input signal supplied from the third stage logic circuit $23_3$ to the third stage flip-flop $22_3$ is in phase with the signal $\overline{Q2}$. When the input signal, or the output signal from the logic circuit $23_3$ is logical "1", the flip-flop $22_3$ inverts the output signals Q3 and $\overline{Q3}$ at the leading edge of the clock signal CK. If, in the initial stage, the output signal Q3 of the flip-flop $22_3$ is logical "0", and the output signal $\overline{Q3}$ is logical "1", the output signal Q3 changes in a logical level at the trailing edge of the signal Q2, as shown in FIG. 4, and has a period eight times that of the output signal Q0 of the binary counter 21. In this way, when the up/down mode signal U/D is logical "1", this counter operates as a down-counter, with its counted values decrementing 15, 14, 13, ..., as shown in FIG. 4.

In the up/down counter device thus arranged and operated, two input terminals are provided for each of the logic circuits $23_1$ to $23_3$ in the logic section 24, to input the JK input signals to the associated flip-flops $22_1$ to $22_3$, respectively, in the counter section 20. Because of this, in the case of a multi-bit counter, the number of elements constituting the counter device is smaller than that of the prior art device. To construct the counter device of the CMOS type, the total number of elements M is expressed by $$M = 70 + 48(m-2) \quad (1)$$

where m is the number of bits. If m is 4, for example, the formula (1) gives 164 of the elements necessary for constructing the prior art counter device. The counter device according to this invention needs 166 elements. The former is slightly smaller than the latter. When m=6, the prior device needs 276 elements, while the counter device of this invention needs 262. The former is slightly larger than the latter. For m=10, the counter device of this invention is approximately 100 elements smaller than the prior art device. That is, if the number of bits m is greater, the necessary circuit elements can be remarkably reduced, and a satisfactory effect attained.

Figure 5:
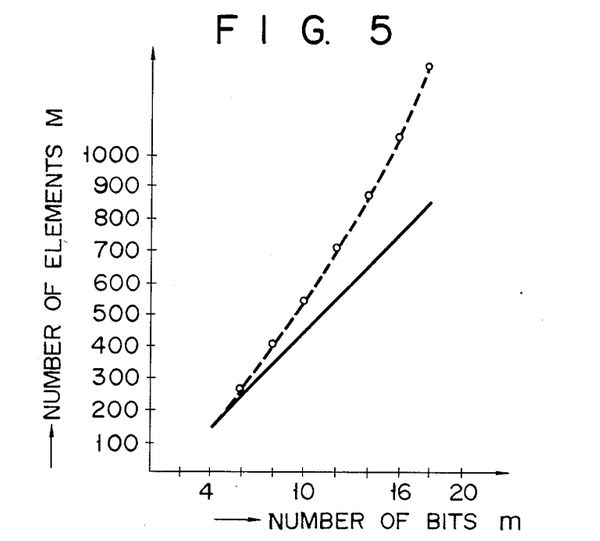
FIG. 5 shows a graph illustrating the relationship of the number of circuit elements to the number of bits.

The relationship between the number of bits m and the number of elements M is illustrated in FIG. 5. On the graph, a dotted line indicates the relationship of the prior device; a solid line indicates that of the this invention. As seen from the graph, when the number of bits m is below 4, both the counter devices require a substantially equal number of elements. When it is above 4, the number of elements M of the prior device exponentially increases with the number of bits m, while that of the counter device of this invention linearly increases.

Figure 6:
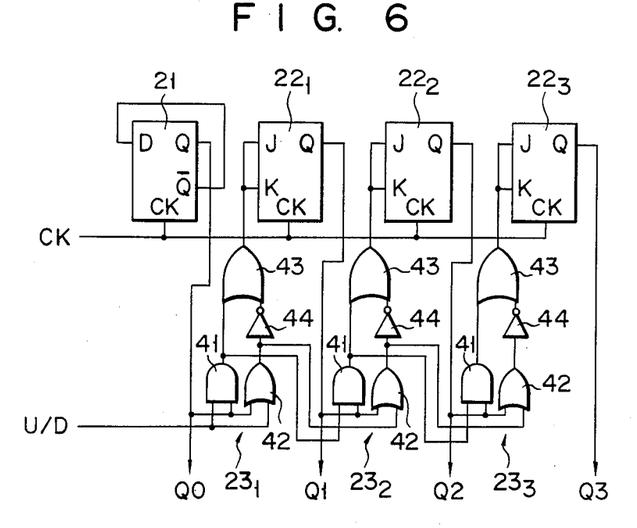
FIG. 6 is a circuit diagram of an up/down counter device according to another embodiment of the invention.

FIG. 6 shows another circuit diagram implementing the scheme illustrated in FIG. 1. Like the counter device of FIG. 4, this counter device is also a 4-bit counter. Each of the logic circuits $23_1$ to $23_3$ is comprised of an AND gate 41, OR gates 42 and 43 and an inverter 44.

In the first stage logic circuit $23_1$, the output signal Q0 from the binary counter 21, and the up/down mode signal U/D are applied separately to both the AND gate 41 and the OR gate 42. The output signal of the AND gate 41 is applied directly to the OR gate 43. The output signal of the OR gate 42 is applied through the inverter 44 to the OR gate 43. The output signal of the OR gate 43 is applied as a JK input signal to the first bit flip-flop $22_1$. The output signals of the AND gate 41 and the OR gate 42 are supplied to the next stage logic circuit $23_2$ in the form of intermediate signals. In the next stage logic circuit $23_2$, the output signal Q1 of the flip-flop $22_1$, and the output signal of the AND gate 41 in the first stage logic circuit $23_1$ are separately applied to the AND gate 41. The signal Q1 and the output signal of the OR gate 42 in the logic circuit $23_1$ are separately applied to the OR gate 42. The output signal of the AND gate 41 is applied directly to the OR gate 43. The output signal of the OR gate 42 is applied to the OR gate 43 through the inverter 44. The output signal of the OR gate 43 is supplied as a JK input signal to the second bit flip-flop $22_2$. The output signals of the AND gate 41 and the OR gate 42 are applied to the next stage logic circuit $23_3$ in the form of intermediate signals. The remaining logic circuit $23_3$ has a circuit arrangement similar to that of the logic circuit $23_2$.

In the up/down counter device thus arranged, when the up/down mode signal U/D is logical "1", the output signal of the OR gate 42 in each of the logic circuits $23_1$ to $23_3$ is always in logical "1". Therefore, the Q output signal of the binary counter 21 or lower stage flip-flop, e.g., $22_1$ is applied through the associated logic circuit, e.g., $23_1$ or $23_2$ to the next stage flip-flop, e.g., $22_1$ or $22_2$, while keeping its logical level. Thus, in this case, the up/down counter device operates as an up-counter device. When the up/down mode signal U/D is logical "0", the output signal of the AND gate 41 in each of the logic circuits $23_1$ to $23_3$ is always kept in logical "0". Therefore, the Q output signal of the binary counter 21 or lower stage flip-flop, e.g., $22_1$ is inverted by the associated logic circuit, e.g., $23_1$ or $23_2$, and input to the upper stage flip-flop, e.g., $22_1$ or $22_2$. Thus, this counter device operates as a downcounter device.

Also in this counter, in each logic circuit $23_1$, $23_2$ or $23_3$ for supplying an input signal to the associated JK flip-flop $22_1$, $22_2$ or $22_3$, the AND gate 41 and the OR gate 42 each have two input terminals, situated irrespective of the bit position. Because of this feature, the multi-bit counter device constructed based on this invention requires a smaller number of circuit elements than the prior device.

For example, the up/down counter device may be a counter device of more than 4 bits, although the 4 bit counter device was used in the above-mentioned embodiment.

As seen from the foregoing description, in the up/down counter device according to this invention a count signal at the 0th bit, as the least significant bit, is obtained by frequency dividing a clock signal into a factor of 2 by a binary counter. When an input signal to the counter device is in a logical level, the logical state of the output signal from the counter device is inverted by flip-flops of n in synchronism with the clock signal, thereby obtaining count signals at the 1st to the n-th significant bits. Logic circuits of n stages are provided. The first stage logic circuit is connected between the binary counter and the first significant bit flip-flop. The remaining logic circuits are each between the adjacent flip-flops. The first stage logic circuit receives an output signal from the binary counter, and the up/down mode signal U/D to form an input signal to the next more significant bit flip-flop. Each of the logic circuits other than the first stage logic circuit receives the intermediate signal from the preceding stage logic circuit, and the output signal from the flip-flop associated with the preceding stage logic circuit. To form an input signal to the flip-flop associated with the present logic circuit. For constructing a multi-bit counter device, this invention requires a smaller number of circuit elements than the prior art.

Figure 7:
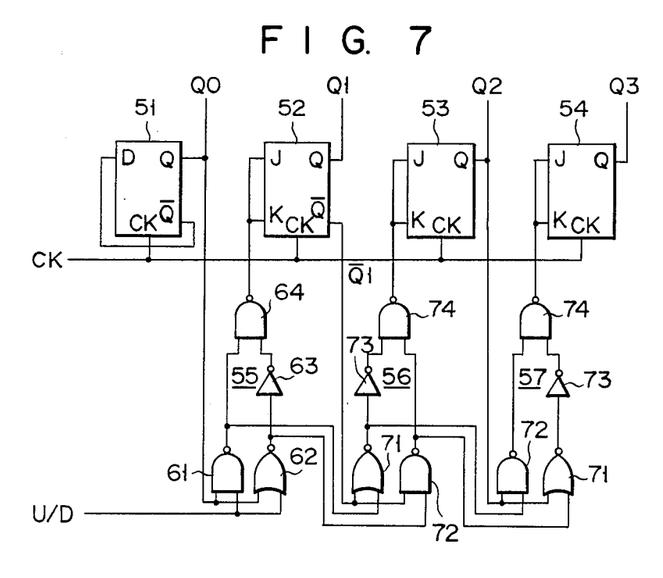
FIG. 7 is a circuit diagram of yet another embodiment according to this invention, which is improved in its speed of operation.

Reference is made to FIG. 7, illustrating another circuit diagram of the up/down counter device of FIG. 1. A clock signal CK is applied to the synchronizing input terminals of a D-type flip-flop 51 and JK flip-flops 51 to 54. The output terminal $\overline{Q}$ and the data input terminal of the D-type flip-flop 51 are shorted to form a binary counter. The Q output signal Q0 is used as the 0th bit count signal, i.e., the count signal of the least significant bit. The JK flip-flops 51 to 54 receives, at the J and K input terminals, the output signals of logic circuits 55 to 57, respectively. The output signals Q1 to Q3 of the flip-flops 52 to 54 are used as the first to third bit count signals.

The logic circuit 55 is inserted between the D-type flip-flop 51 and the JK flip-flop 52. The logic circuit 55 is comprised of a NAND gate 61, a NOR gate 62, an inverter 63 and a NAND gate 64. The gates 61 and 62 receive the output signal Q0 of the D-type flip-flop 51, and an up/down mode signal U/D. The output signal of the NAND gate 61 is applied directly to the NAND gate 64. The NAND gate 64 also receives the output signal of the NOR gate 62, via the inverter 63. The output signal of the NAND gate 64 is applied as J and K input signals to the JK flip-flop 52.

The next stage logic circuit 56 is inserted between the JK flip-flops 52 and 53. The logic circuit 56 is comprised of a NOR gate 71, a NAND gate 72, an inverter 73, and a NAND gate 74. The NOR gate 71 receives the output signals of the NAND gate 61 and the JK flip-flop 52. The NAND gate 72 receives the output signals of the NOR gate 62 and the JK flip-flop 52. The NAND gate 74 is supplied with the output signal of the NAND gate 72 as well as the output signal of the NOR gate 71 through the inverter 73. The output signal of the NAND gate 74 is applied as J and K input signals to the JK flip-flop 53.

The next stage logic circuit 57 is inserted between the JK flip-flops 53 and 54. The logic circuit 57 is comprised of a NOR gate 71, a NAND gate 72, an inverter 73 and a NAND gate 74. The NOR gate 71 receives the output signal of the NAND gate 72 and the output signal $\overline{Q2}$ of the JK flip-flop 53. The NAND gate 72 receives the output signal of first NOR gate 71 of the logical circuit 56, and the output signal $\overline{Q2}$ of the JK flip-flop 53. The output signals of the NAND gate 72 and the NOR gate 71 are applied through the inverter 73 to the NAND gate 74. The output signal of the NAND gate 74 is applied as J and K input signals to the JK flip-flop 54.

The logic circuit 55 receives the output signal Q0 of the D-type flip-flop 51, and the up/down mode signal U/D, and forms an input signal to the JK flip-flop 52. The next stage logic circuit 56 receives the intermediate signals of the logic circuit 55, i.e., output signals of the NAND gate 61 and the NOR gate 62, and the output signal $\overline{Q1}$ of the JK flip-flop 52, and forms an input signal to the JK flip-flop 53. The logic circuit 57 receives the intermediate signals of the logic circuit 56, i.e., output signals of the NAND gate 61 and the NOR gate 62, and the output signal Q2 of the JK flip-flop 53, and forms an input signal to the JK flip-flop 54. Thus, the output signal Q0 of the D-type flip-flop 51 is applied to the logic circuit 55. The output signal $\overline{Q}$ of the JK flip-flop 52 is applied to the logic circuit 56. The output signal Q2 of the JK flip-flop 53 is applied to the logic circuit 57. Thus, the output signals Q and $\overline{Q}$ from the flip-flops 51 to 53 are alternately applied to the logic circuits 55 to 57, as shown.

The operation of the up/down counter device, thus arranged, will be given. The up/down counter device is set to an up count mode by setting the up/down mode signal U/D to logical "1", while it is set to a down count mode by setting that signal to logical "0".

The up count operation of the counter device will be given with reference to FIG. 8. The D-type flip-flop 51 frequency-divides the clock signal CK into a factor of two. Accordingly, the output signal Q0 has a period two times that of the clock signal CK. At this time, the up/down mode signal U/D is logical "1", and in the logic circuit 55, the output signal of the NOR gate 62 remains in logical "0", irrespective of the logical state of the output signal of the flip-flop 51. The NAND gate 61 inverts the output signal Q0 of the D-type flip-flop 51 and applies it to the NAND gate 64. Since the output signal of the NOR gate 62 is logical "0", and the output signal of the inverter 63 connecting to it is logical "1", the NAND gate 64 serves as an inverter for inverting the output signal of the NAND gate 61. Accordingly, the J and K input signals to the JK flip-flop 52 are in phase with the signal Q0. The JK flip-flop 52 for producing the first bit count signal Q1 inverts its output at the leading edge of the clock signal CK when the output signal of the logic circuit 55 is logical "1". If, in the initial stage, the output signal Q1 of the JK flip-flop 52 is logical "0", the signal Q1 changes at the trailing edge of the signal Q0, and has a period two times that of the signal Q0, as shown in FIG. 8.

In the logic circuit 56, the NAND gate 72 receives the logical "0" signal output from the NOR gate 62 in the logic circuit 55 so that the output signal of the NAND gate 72 is kept in logical "1". The NOR gate 71 serves as an inverter for inverting the complement output signal $\overline{Q}$ of the JK flip-flop 52, and connects its output for transfer to the NAND gate 74, serving as an inverter. Accordingly, the JK input signal supplied from the logic circuit 56 to the JK flip-flop 53 is out of phase with the signal $\overline{Q}$ of the JK flip-flop 52, that is, in phase with the signal Q thereof. The JK flip-flop 53 inverts its output at the leading edge of the clock signal CK when the output signal of the logic circuit 56 is logical "1". If, in the initial stage, the output signal Q2 of the JK flip-flop 53 is logical "0", the signal Q2 changes at the trailing edge of the signal Q1 and has a period four times that of the signal Q0, as shown in FIG. 8.

In the logic circuit 57, the NOR gate 71 receives the logical "1" signal output from the NAND gate 72 in the logic circuit 56. Accordingly, the output signal of the NOR gate 71 is kept in logical "0", and the output signal of the inverter 73 connecting to it is kept logical "1". The NAND gate 72 serves as an inverter for inverting the output signal Q2 of the JK flip-flop 53, with its output signal supplied to the NAND gate 74 serving as an inverter. Therefore, the J and K input signals supplied to the JK flip-flop 54 are in phase with the signal Q2. The JK flip-flop 54 inverts its output signal at the leading edge of the clock signal CK when the output signal of the logic circuit 56 is logical "1". If, in the initial stage, the output signal Q3 of the JK flip-flop 54 is logical "0", the signal Q3 changes in a logical level at the trailing edge of the signal Q2 and has a period eight times that of the signal Q0, as shown in FIG. 8.

Figure 8:
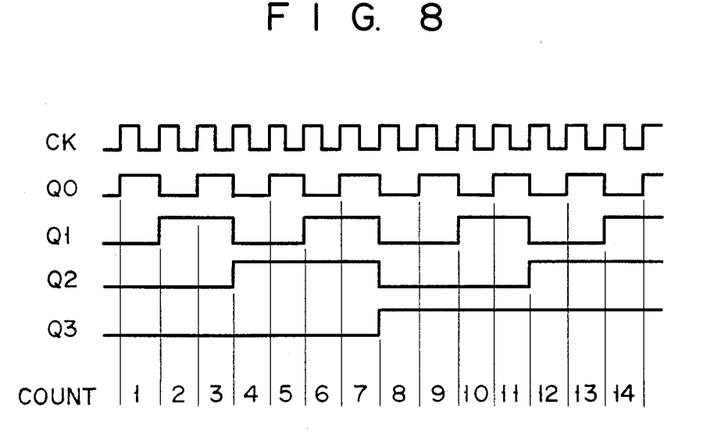
FIGS. 8 and 9, respectively, show time charts for explaining the up and down count operations of the up/down counter device of FIG. 7.

In this way, the up/down counter device operates as an up-counter when the up/down mode signal U/D is logical "1", and its count is incremented step by step, as shown in FIG. 8.

The down count operation of the counter device will be given with reference to FIG. 9. The D-type flip-flop 51 frequency-divides the clock signal CK into a factor of two, as in the up-count operation. Accordingly, the output signal Q0 has a period two times that of the clock signal CK. At this time, the up/down mode signal U/D is logical "0", and then, in the logic circuit 55, the output signal of the NAND gate 61 remains in logical "1", irrespective of a logical state of the output signal of the NAND gate 61. The NOR gate 62 inverts the output signal Q0 of the D-type flip-flop 51 and applies it to the NAND gate 64, via the inverter 63. Accordingly, the J and K input signals supplied from the logic circuit 55 to the JK flip-flop 52 are out of phase with the signal Q0. The JK flip-flop 52 for producing the first bit count signal Q1 inverts its output at the leading edge of the clock signal CK when the output signal of the logic circuit 55 is logical "1". If, in the initial stage, the output signal Q1 of the JK flip-flop 52 is logical "0", the signal Q1 changes at the leading edge of the signal Q0 and has a period two times that of the signal Q0, as shown in FIG. 9.

In the logic circuit 56, the NOR gate 71 receives the logical "1" signal output from the NAND gate 61 in the logic circuit 55, so that the output signal of the NOR gate 71 is kept in logical "0". The output signal of the inverter 73 connecting to it is kept in logical "1". The NAND gate 72 serves as an inverter for inverting the output signal $\overline{Q1}$ of the JK flip-flop 52, and connects its output for transfer to the NAND gate 74 serving as an inverter. Accordingly, the JK input signal supplied from the logic circuit 56 to the JK flip-flop 53 is in phase with the signal $\overline{Q1}$. The JK flip-flop 53 inverts its output at the leading edge of the clock signal CK when the output signal of the logic circuit 56 is logical "1". If, in the initial stage, the output signal Q2 of the JK flip-flop 53 is logical "0", the signal Q2 changes at the leading edge of the signal Q1 and has a period four times that of the signal Q0, as shown in FIG. 9.

In the logic circuit 57, the NAND gate 72 receives the logical "0" signal output from the NOR gate 71 in the logic circuit 56. Accordingly, the output signal of the NAND gate 72 is kept in logical "0". The NOR gate 71 serves as an inverter for inverting the output signal Q2 of the JK flip-flop 53, with its output signal supplied, via the inverter 73, to the NAND gate 74 serving as an inverter. Therefore, the J and K input signals supplied from the D-type flip-flop 51 to the JK flip-flop 54 are out of phase with the signal Q2. The JK flip-flop 54 inverts its output signal at the leading edge of the clock signal CK when the output signal of the logic circuit 56 is logical "1". If, in the initial stage, the output signal Q3 of the JK flip-flop 54 is logical "0", the signal Q3 changes at the trailing edge of the signal Q2 and has a period eight times that of the signal Q0, as shown in FIG. 9.

Figure 9:
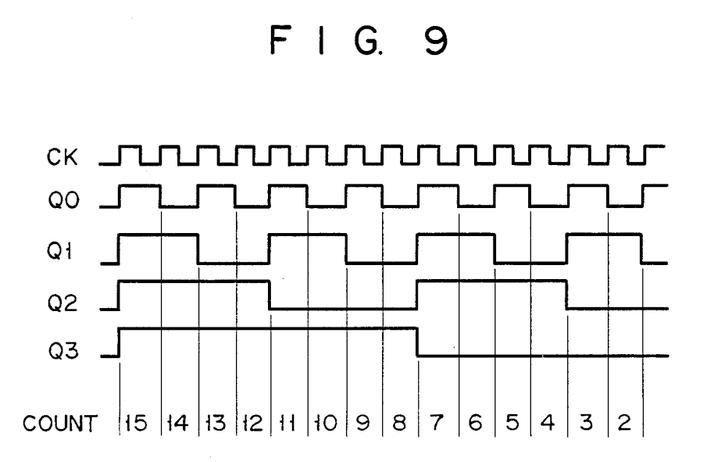

In this way, the up/down counter device operates as a down-counter when the up/down mode signal U/D is logical "0", and its count is decremented step by step, as shown in FIG. 9.

With such an arrangement of the up/down counter device, in each logic circuit for applying the input signal to the associated JK flip-flop, the number of the input terminals of each of the gates 71 and 72 is two, irrespective of the bit position. Therefore, the multibit counter can be constructed without abnormally increasing the number of circuit elements.

It is further noted that the up/down mode signal U/D passes through only one NOR gate or NAND gate when it selects either the up or down count mode of the counter device. Though an erroneous operation of the counter device of FIG. 2 frequently occurs when the counter device operates under control by a high rate clock signal CK, this feature shifts the erroneous operating point to a higher frequency side. Therefore, the up/down counter device of this embodiment can be operated at a high speed.

Figure 10:
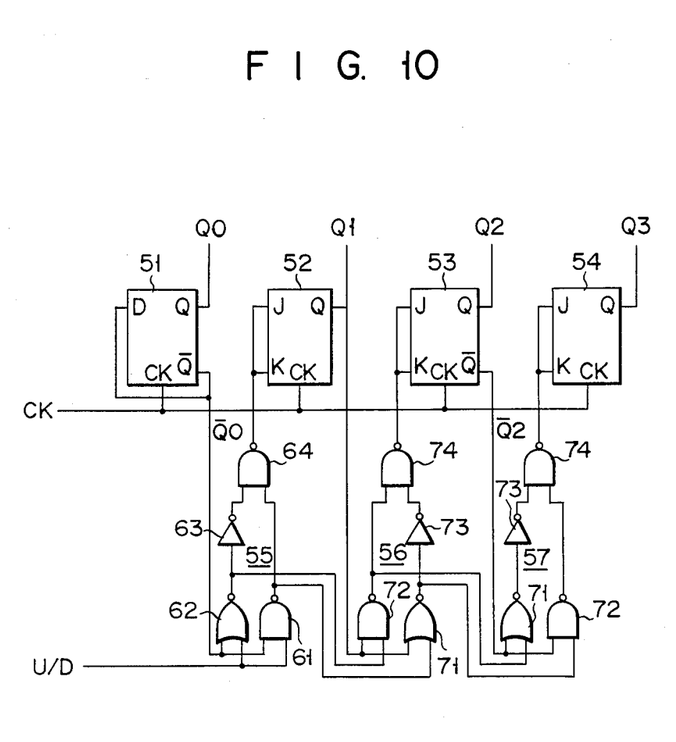
FIG. 10 is a circuit diagram of a further embodiment of this invention which is also improved in its speed of operation.

FIG. 10 shows a further circuit diagram of the FIG. 1 circuit according to this invention. In the counter device of FIG. 10, the logic circuit 55 receives the output signal $\overline{Q0}$ of the D-type flip-flop 51, and the up/down mode signal U/D, and forms an input signal to the JK flip-flop 52. The logic circuit 56 receives the intermediate signals of the logic circuit 55, and the output signal Q1 of the JK flip-flop 52 and forms an input signal to the JK flip-flop 53. The next stage logic circuit 57 receives the intermediate signals of the logic circuit 56, and the output signal $\overline{Q2}$ of the JK flip-flop 53 and forms an input signal to the JK flip-flop 54. The output signal $\overline{Q0}$ of the D-type flip-flop 51 is supplied to the logic circuit 55. The output signal Q1 of the JK flip-flop 52 is supplied to the logic circuit 56. The output signal $\overline{Q2}$ of the JK flip-flop 53 is connected to the logic circuit 57. Thus, the output signals Q and $\overline{Q}$ of these flip-flops 51 to 53 are alternately applied to the three logic circuits 55 to 57.

This up/down counter device operates as a down counter for logical "1" of the up/down mode signal U/D, and as an up counter for logical "0" of the signal U/D. The up and down operations of this counter device will be omitted since the operations are as illustrated in FIGS. 8 and 9.

What is claimed is:

1. An up/down counter device comprising:
   clock signal generating means for generating clock signals;
   binary counter means having output means for producing a count signal of the 0th bit in synchronism with the clock signal;
   1st to nth flip-flop means for producing count signals of 1st to nth bits in synchronism with the clock signal, said 1st to nth stage flip-flop means each having JK terminal means and output means;
   up/down mode signal generating means having output means for generating an up/down mode signal;
   first stage logic circuit means connected between the output means of said binary counter means and the JK terminal means of said first stage flip-flop means, said first stage logic circuit means including a first logic circuit portion having input and output means, said input means being connected to the output means of said binary counter means and supplied with said up/down mode signal and said output means outputting an output signal, and a second logic circuit portion connected in series to said first logic circuit portion and having output means connected to the JK terminal means of said first stage flip-flop means;
   second to nth stage logic circuit means each including a first logic circuit portion having output means for outputting an output signal and a second logic circuit portion connected in series to said first logic circuit portion of the second to nth stage logic circuit means, the outputs of said logic circuit means being coupled to said JK terminal means of respective stage flip-flop means;
   means for connecting the output means of said first logic circuit portion of said first stage logic circuit means to the input means of the first logic circuit portion of said second stage logic circuit means to supply the output signal thereof as an up/down signal to said second stage logic circuit means and for connecting the output means of the first logic circuit portion of each of said second to (n-1)th stage logic circuit means to the input means of the first logic circuit portion of the succeeding stage logic circuit means to supply the output signal thereof as an up/down signal to the succeeding stage logic circuit means.

2. The counter device according to claim 1, in which said first logic circuit portion of each of said first stage logic circuit means followed by said second to nth stage logic circuit means comprises a NAND gate and a NOR gate each having output and input means, said input means being connected to said output means of said binary counter and said up/down mode signal generating means to be supplied with the up/down signal and a complement output signal of said binary counter means, an inverter having output means and input means, said input means being connected to the output means of said NOR gate, and said second logic circuit portion of each of said first stage logic circuit means followed by said second to nth stage logic circuit means comprises a NAND gate having output means connected to the JK terminal means of said first flip-flop means and input means connected to the output means of said inverter and said NAND gate, and said flip-flop means having complement output means.

3. The counter device according to claim 2, in which said first logic circuit portion of each of said second to nth stage logic circuit means comprises a first NAND and NOR gate each having output means and input means, said input means being coupled with the output means of said first logic circuit portion of the preceding stage logic circuit means and the complement output means of said flip-flop means, and an inverter having output means and input means, said input means being connected to the output means of said NOR gate and said second logic circuit portion of each of said second to nth stage logic circuit means includes a second NAND gate having output means connected to the JK terminal means of the corresponding one of said second to nth stage flip-flop means and input means coupled with the output means of said inverter and said first NAND gate.

4. The counter device according to claim 1, in which said first logic circuit portion of each of said first stage logic circuit means followed by said second to nth stage logic circuit means comprises an AND gate and a first OR gate each having output means and input means, said input means being coupled with the output means of said binary counter means and said up/down mode signal generating means to be supplied with the up/down mode signal and the count signal of said binary counter means and said second logic circuit portion of each of said first stage logic circuit means followed by said second to nth stage logic circuit means includes an inverter having output means and input means, said input means being connected to the output means of said first OR gate, and a second OR gate having output means connected to the JK terminal means of said first flip-flop means and input means coupled with the output means of said inverter and the output means of said AND gate.

5. The counter device according to claim 4, in which said first logic circuit portion of each of said second to (n-1)th stage logic circuit means includes an AND gate and a first OR gate each having output means and input means, said input means being coupled with the output means of the first logic circuit portion of the preceding stage logic circuit means and the output means of the corresponding one of said first to (n-1)th stage flip-flop means, and said second logic circuit portion of each of said second to (n-1)th stage logic circuit means includes an inverter having output means and input means, said input means being connected to the output means of said first OR gate and a second OR gate having output means connected to the JK terminal means of the corresponding one of the second nth stage flip-flop means and input means coupled with the output means of said inverter and said AND gate.

6. The counter device according to claim 1, in which said first logic portion of each of said first stage logic circuit means followed by said second to said nth stage logic circuit means comprises a first NAND gate and a NOR gate which have output means and input means, said input means being coupled with the output means of said binary counter means and said up/down mode signal generating means to be supplied with the output signal of said binary counter means and the up/down mode signal, and said second logic circuit portion of each of said first stage logic circuit means followed by said second to nth stage logic circuit means includes an inverter having output means and input means, said input means being connected to the output means of said NOR gate and a second NAND gate having output means connected to the JK terminal of said first stage flip-flop means and input means connected to the output means of said first NAND gate and the output means of the inverter.

7. The counter device according to claim 6 in which said second to (n-1)th stage logic circuit means are alternately supplied with negative and positive outputs from said first and (n-1)th flip-flop means and said first logic circuit portion of each of said second to (n-1)th stage logic circuit means includes a first NAND gate and a NOR gate and a NOR gate which are coupled with one of either the negative output means or the positive output means of said first to (n-1)th flip-flop means and the output means of the first logic circuit portion of said preceding stage logic circuit means, and said second logic circuit portion of each of said second to (n-1)th stage logic circuit means includes an inverter having output means and input means, said input means being connected to the output means of said NOR gate, and a second NAND gate having output means connected to the JK terminal means of the corresponding one of said second to nth flip-flop means and input means connected to the output means of said inverter and said first NAND gate, the first NAND gate of each of said logic circuit means being connected to the ouput of the NOR gate of said preceding stage logic circuit means, and the NOR gate of each of said logic circuit means being connected to the output of the first NAND gate of said preceding stage logic circuit means.

8. The counter device according to claim 1, in which said first logic circuit portion of each of said first stage logic circuit means followed by second to nth stage logic circuit means comprises a first NAND gate and a NOR gate having output means and input means, said input means being coupled with the negative output means of said binary counter means and supplied with an up/down made signal, the output means of said up/down mode signal generating means to be supplied with the negative output signal of said binary counter means, and said second logic circuit portion of each of said first stage logic circuit means followed by said second to nth stage logic circuit means includes an inverter having output means and input means, said input means being connected to the output means of said NOR gate, and a second NAND gate having output means connected to the JK terminal of said first flip-flop means and input means coupled with the output means of said first NAND gate and said inverter.

9. The counter device according to claim 8, in which second to nth stage logic circuit means are alternately supplied with positive and negative outputs from said first and (n-1)th flip-flop means and said first logic circuit portion of each of said second to nth stage logic circuit means includes a first NAND gate and a NOR gate having output means and input means, said input means being coupled with the output means of the corresponding one of said first to (n-1)th flip-flop means and the output means of the first logic circuit portion of said preceding stage logic circuit means, and said second logic circuit portion of each of said second to nth stage logic circuit means includes an inverter having output means and input means, said input means being connected to the output means of said first NOR gate and a second NAND gate having output means connected to the JK terminal means of the corresponding one of said first to (n-1)th flip-flop means and input means connected to the output means of said inverter and said first NAND gate, wherein the input means of the first NAND gate of each of said logic circuit means is connected to the output means of the NOR gate of said preceding stage logic circuit means, and the NOR gate of each of said logic circuit means, and the output means of the NOR gate of each of said logic circuit means is connected to the output means of the first NAND gate of the preceding stage logic circuit means.

* * * * *